United States Patent [19]

Phillips et al.

[11] Patent Number: 4,889,319
[45] Date of Patent: Dec. 26, 1989

[54] BAKEABLE VACUUM SYSTEMS

[75] Inventors: Robert B. Phillips, Horsham; Paul R. Stonestreet, Newport Pagnall, both of England

[73] Assignee: VG Instruments Group Limited, Crawley, England

[21] Appl. No.: 202,692

[22] Filed: Jun. 3, 1988

[30] Foreign Application Priority Data

Jun. 5, 1987 [GB] United Kingdom ............... 8713241

[51] Int. Cl.⁴ .............................................. F16K 51/02
[52] U.S. Cl. ................... 251/368; 277/DIG. 6
[58] Field of Search .................. 137/334, 341, 375; 251/333, 334, 368, 900; 277/DIG. 6

[56] References Cited

U.S. PATENT DOCUMENTS 4,553,562 11/1985 Nohada ............................... 137/375
4,572,233 2/1986 Weeden ............................... 137/375

FOREIGN PATENT DOCUMENTS

1210814 11/1970 United Kingdom ................ 251/334

Primary Examiner—John Fox
Attorney, Agent, or Firm—Chilton, Alix & Van Kirk

[57] ABSTRACT

An apparatus and method providing a bakeable sealing means for a vacuum system, and thereby an improved bakeable ultra-high vacuum system; the apparatus comprising: a first sealing element composed substantially of an elastomeric material; a second sealing element comprising PTFE; and means for engaging the first sealing element with the second sealing element and for compressing the first sealing element; as for example in an improved bakeable seal between a first and a second flange, or in a gate valve, or a vacuum chamber entry lock.

6 Claims, 6 Drawing Sheets

BAKEABLE VACUUM SYSTEMS

This invention relates to bakeable vacuum systems and is particularly, though not exclusively, concerned with improvements to apparatus for the processing of semiconductor devices by molecular beam epitaxy.

To achieve the conditions of vacuum as may be required, for example, for the processing of semiconductor devices or the microanalysis of surfaces, it is a usual practice when preparing a vacuum system to bake it typically in excess of 200° C. for several hours. Such baking removes, from the walls and components of the system, gases which otherwise would be released more slowly into the system inhibiting the attainment of a high or ultra high vacuum. It is important, therefore, that the components of a vacuum system are able to withstand the effects of baking. In particular, the seals of a vacuum system, which may be in valves or between the mating surfaces of flanges, must maintain their integrity after baking. Moreover, in certain applications such as the seal of a sample entry port or the seal in an isolation valve, it is advantageous if the same components may be reused, and hence subjected to baking, many times. Detailed descriptions of vacuum seals, and the factors influencing the selection of suitable materials, are given by A. Roth in Vacuum Sealing Techniques, published by Pergamon Press in 1966.

Several types of seal commonly used in vacuum systems comprise synthetic elastomeric polymers usually in the form of O-rings, as described for example by R. N. Peacock in the Journal of Vacuum Science and Technology, volume 17, number 1, 1980, pages 330 to 336. Baking alters the properties of these materials and consequently affects the degree of vacuum which may be attained in a system comprising them as seals. A beneficial consequence of baking is that the outgassing rate is reduced; according to R. N. Peacock, baking at 100° C. for 16 hours can reduce the outgassing rate of the commonly used fluoroelastomer Viton from above $10^{-8}$ torr $1 \, s^{-1} \, cm^{-2}$ to around $10^{-10}$ torr $1 \, s^{-1} \, cm^{-2}$. However, a detrimental consequence of baking is that it enhances the loss of elasticity under compression known as "compression set", as a consequence of which a component tends to retain its compressed shape and subsequently may not remake an adequate seal. Compression set is a serious disadvantage in a seal which is required to be opened and re-sealed numerous times as on a sample entry port or in an isolation valve for example. Hence, while in some applications an elastomer seal component, such as an O-ring, may usefully be outgassed by baking when in an uncompressed state, in general elastomer seals are considered to be unsuitable for use in vacuum systems where the seal may need to be baked in a compressed state for several hours, particularly in ultra-high vacuum systems in which an ultimate pressure of less than $10^{-11}$ torr may be required.

Conventional, bakeable, vacuum systems commonly have all-metal seals in which a seal is made by the interaction of hard and soft metal components. Typically the soft metal may be copper, aluminum, indium or gold, and the hard metal a stainless steel. The sealing action depends upon the deformation of the soft metal, and in some cases there may be provided knife-edges in the hard metal components to bite into the soft metal. For example, a flange seal may comprise a copper gasket disposed between stainless steel flanges having knife-edges. Several types of all-metal bakeable valve which comprise hard and soft metals are known, as described for example by A. Roth op cit. A further type of metal valve is described in U.S. Pat. No. 3,397,862 in which a bevelled or wedge-shaped metal gate is brought into contact with a flat sealing surface coated with polytetrafluoroethylene; the bevelled gate is bent under compression to make a seal, the angle of the bevel corresponding to the degree of bending of the gate.

The vacuum systems typical of apparatus for semiconductor processing require seals of various forms, such as in valves or doors at sample entry ports. Also, such apparatus may comprise several interconnecting chambers, each of which may have a specific function in the stages of processing, and valves are provided to isolate each chamber. Typical of such apparatus is the V80 silicon molecular beam epitaxy system manufactured by VG Semicon Ltd, of West Sussex, England. It is desirable in such systems to have the facility to isolate and bake each chamber, and this requires that valves be baked when closed. In conventional vacuum systems it is usual to employ metal seals, in all-metal valves, because of their ability to withstand baking especially when closed. However, a disadvantage with all-metal valves and seals is their cost, both in manufacture and servicing. Moreover, it is well known that the torque applied to metal seals must be carefully controlled to avoid progressive deterioration of a re-usable seal, and to ensure adequate sealing; this is an inconvenience in use, particularly in systems such as apparatus for molecular beam epitaxy where seals and valves are frequently closed and re-opened in operation.

It is therefore an object of this invention to provide a bakeable sealing means, compatible with high and ultra-high vacuum conditions, which is cheaper and more convenient in use than known sealing means. It is also an object of this invention to provide a bakeable vacuum system, and it is a further object to provide a system, for semiconductor processing, typically by molecular beam epitaxy, having improved bakeable sealing means. It is also an object to provide a method for sealing, and of operating, a bakeable vacuum system.

Thus according to one aspect of the invention there is provided a bakeable sealing means comprising: a first sealing element composed substantially of an elastomeric material; a second sealing element comprising PTFE; and means for engaging said first sealing element with said second sealing element and for compressing said first sealing element.

Preferably the first sealing element is an elastomeric gasket and the sealing means also comprises a first member and a second member between which said gasket may be compressed, and at least one of said first and second members has a surface comprising PTFE, or at least has a surface coated with a material comprising PTFE, in a region contactable with said gasket. For example the sealing means may comprise an elastomeric gasket compressed between two flanges each coated with a material comprising PTFE where they come into contact with the gasket.

In preferred embodiments the sealing means comprises: a first member having a face in which there is formed a groove; an elastomeric gasket located in said groove; and a second member having a face at least a region of which is coated with a material comprising PTFE.

The term PTFE means polytetrafluoroethylene or a formulation thereof such as Fluoralon (supplied by Fluorocarbon Industrial Treatments of Sheffield) or Teflon (which is a registered trademark of E. I. Du Pont de Nemours & Company). The second sealing element is conveniently, though not necessarily, in the form of a coating on a substrate member such as a flange or a valve seat; alternatively the second sealing element may substantially be made of PTFE. The coating is preferably, though not necessarily, about 0.01 mm to 0.10 mm thick, and may be applied by any convenient method, for example: the PTFE may be obtained in a resinous suspension which is applied to the substrate and is subsequently cured by heating; the material of a coat formed in this way will comprise PTFE and a residue of resin.

The first sealing element is preferably a gasket composed of an elastomer, preferably a fluorocarbon polymer such as Viton or Kalrez (these are trademarks of E. I. Du Pont de Nemours & Company). In prior vacuum systems such materials are not used when a system is to be baked, with seals compressed. However, we have found that a sealing means according to our invention may be baked to a temperature for example in the region of 250° C. for several hours, and that subsequently ultra high vacuum conditions with a pressure as low as $10^{-12}$ torr may be attained. Such conditions are required for example in apparatus for semiconductor processing by molecular beam epitaxy, or in apparatus for the analysis of the surfaces of materials. Conveniently the first sealing element may take the form of an O-ring, by which it will be understood that an O-ring gasket may have circular or elliptical aspect, for example, and is not restricted to any particular geometric shape or cross-section.

In a preferred embodiment, which may constitute a seal between a pair of flanges of a vacuum system, the sealing means comprises: a first member which is a first flange having a annular groove in which is located an elastomeric O-ring gasket; and a second member which is a second flange having, as the second sealing element, a face coated with a material comprising PTFE over a region contactable with the O-ring gasket. Examples of the application for such a pair of flanges are: for making a joint between two pipes, or as a seal at an entry door to a vacuum chamber.

In another aspect there is provided a bakeable vacuum system comprising: a chamber having at least one bakeable sealing means as defined above; and means for baking said chamber.

In another aspect there is provided a bakeable vacuum system comprising: a vacuum chamber having an entry port with an annular flange disposed circumferentially around said entry port, said annular flange having a face with an annular groove in which is located an elastomeric O-ring; an entry door flange having a surface coated with a material comprising PTFE over a region contactable with said O-ring; means for moving said door flange towards and away from said annular flange; and means for baking at least said vacuum chamber. Alternatively the annular flange may have a coat comprising PTFE and the door flange may have an annular groove in which is located an O-ring. The flanges may be joined together by bolts or suitable clamping means. An advantage of the present invention over seals comprising metal gaskets is that less compressive force per unit length of gasket or O-ring is needed to achieve a satisfactory seal; this is more convenient in assembling and disassembling the seal. We have found that for certain flanges no bolts may be required, and that atmospheric pressure may provide sufficient force to hold a door flange, for example, in place. There may also be provided a bakeable vacuum system with a vacuum chamber having an entry lock comprising an entry port with first and second ends each of which can be sealed by means of an O-ring in compression against a seal face composed substantially of PTFE: the first end being sealed by an entry door flange as described above; there being at the second end a seal face comprising PTFE and there being also provided a manipulator for bringing a second flange, having a groove in which is located an O-ring, against said seal face; movement of the manipulator is conveniently accommodated by a bellows.

In a further preferred embodiment of the invention there is provided a valve comprising a seat coated with a material comprising PTFE, and means for urging an elastomeric gasket, preferably an O-ring, against said seat. Typically such a valve has a housing and preferably the PTFE-coated seat is stationary with respect to the housing and a moveable member is provided for urging the gasket against the seat; however the invention is not restricted to that arrangement and alternatively the gasket may be held stationary with respect to the valve housing and a moveable PTFE-coated member provided for urging against the O-ring.

The invention may provide several forms of valve, for example; a butterfly valve, poppet valve or bellows valve, in which the valve seat is coated with a material comprising PTFE. In an especially preferred embodiment there is provided a gate valve comprising: a valve gate having a surface in which is formed an annular groove; an elastomeric O-ring disposed in said groove; an annular valve seat defining an aperture and coated with a material comprising PTFE; and means for applying a force to said valve gate thereby urging said elastomeric O-ring against said valve seat, and thereby providing a means for substantially blocking said aperture and closing the gate valve. Alternatively there may be provided a gate valve comprising: a valve seat in which is formed a groove with an O-ring disposed therein; and a valve gate moveable towards and away from the valve seat and coated with a coating comprising PTFE over a region contactable with the O-ring.

In another aspect there is provided a bakeable vacuum system e.g. adapted for processing semiconductor materials by molecular beam epitaxy (MBE) and comprising: a plurality of chambers, each chamber having at least one entry for having sealing means comprising a first sealing element composed substantially of an elastomer, and a sealing member having a face coated with a material comprising PTFE; and means for baking at least one said chamber. The baking means may conveniently comprise ovens which may be assembled around one or more of said chambers, the ovens having electrical heating elements; alternatively heating tapes may be wrapped around the chambers which are to be heated. In a preferred embodiment said bakeable vacuum system comprises at least two chambers and an isolating valve disposed between said chambers, said isolating valve having a seat coated with a material comprising PTFE, and a member for urging an elastomer seal against said seat. Preferably said isolating valve is a gate valve. Samples may be introduced into such a system through an entry port which can be sealed, for example, by an entry door comprising a flange, or by a gate valve.

Typically the bakeable MBE system comprises at least a sample preparation chamber, in which a sample may be cleaned by ion bombardment for example, and a deposition chamber in which a sample is exposed to molecular beams in order to have material deposited upon it. There may also be provided an analysis chamber, having apparatus for analyzing the sample by electron spectroscopy or diffraction techniques for example. Preferably the chambers are linked via a gate valve, constructed according to the invention, which may be baked when closed thereby allowing the chambers to be baked when isolated from each other; this avoids cross-contamination between the chambers. It will be appreciated that clean, uncontaminated conditions are essential for the successful manufacture of semiconductor devices. In conventional MBE systems an all-metal valve may be used in such applications, however the present invention provides a system which is more convenient in use, and is simpler and cheaper to service than known systems.

According to another aspect we provide a bakeable vacuum system having at least one pneumatic actuator comprising: a substantially cylindrical housing, having a wall with an inner surface composed substantially of PTFE; a substantially cylindrical piston disposed within said housing, at least one elastomeric O-ring disposed around a circumference of said piston and in contact with said inner surface of said housing, making a substantially gas-tight seal; a rod having a first end attached to said piston, said rod passing through an elastomeric seal located in a hole in said housing, said rod having a surface composed of a material comprising PTFE in contact with said elastomeric seal; and means for introducing gas to and for extracting said gas from, said housing, through ports at either side of said piston, thereby applying a force to said piston and moving said piston and said rod. In a preferred embodiment the rod is linked by means comprising a linear motion feed through, typically comprising a bellows, to shuttering means in an MBE apparatus. In this way the actuator is used to open and close the shuttering means shuttering means on effusion sources such as Knudsen cells. The advantage of this aspect of the invention is that it provides an MBE apparatus from which the pneumatic actuators need not be detached while the apparatus is being baked to attain ultra high vacuum conditions.

According to another aspect there is provide method of sealing a bakeable vacuum system comprising engaging a first sealing element substantially of an elastomeric material with a second sealing element comprising PTFE.

According to a further aspect there is provided a method of operating an apparatus for molecular beam epitaxy comprising a plurality of chambers, the method comprising the steps of isolating at least one of said chambers by engaging an elastomeric seal portion with a seal portion comprising PTFE, and baking and pumping out at least one of said chambers.

Preferred embodiments of the invention will now be described by way of example and with reference to the figures in which.

Figure 1:
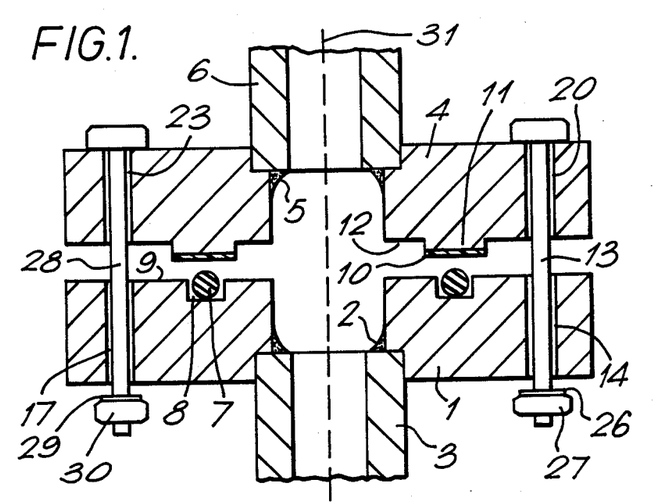
FIG. 1 is a sectional elevation of a flange joint having a bakeable seal according to the invention.

Referring first to FIG. 1 there is shown a bakeable seal according to the invention: a first flange 1 is fixed by a weld 2 to a first pipe 3, and a second flange 4 is fixed by a weld 5 to a second pipe 6; a first sealing element is provided which is an elastomeric O-ring 7 located in an annular groove 8 formed in a surface 9 of flange 1; and a second sealing element is provided which is a PTFE coat 10, coated onto a region 11 of a face 12 of flange 4. Also shown are: a bolt 13, fitted through a hole 14 in flange 1 and a hole 20 in flange 4, with a washer 26 and a nut 27; and a bolt 28, fitted through a hole 17 in flange 1 and a hole 23 in flange 4, with a washer 29 and a nut 30. An axis 31 is also shown on FIG. 1.

Figure 2:
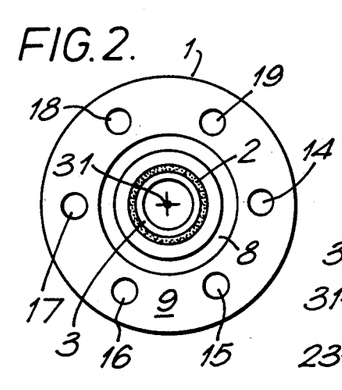
FIGS. 2 and 3 are face views of the respective flanges of FIG. 1.
Figure 3:
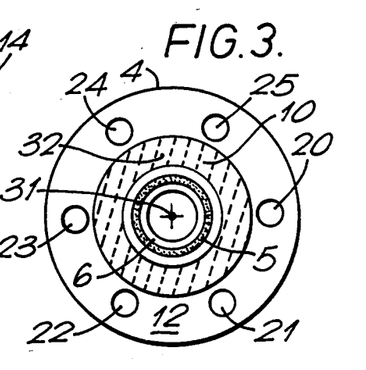

Another view of flange 1 is given in FIG. 2 which shows: axis 31, part of pipe 3, weld 2, annular groove in face 9, and six holes 14 to 19. Another view of flange 4 is given in FIG. 3 which shows: axis 31, part of pipe 6, weld 5, surface 32 of coat 10 on face 2, and six holes 20 to 25. FIG. 3 shows that surface 32 is an annulus positioned opposite annular groove 8 and O-ring 7. Flanges 1 and 4 are shown slightly separated on FIG. 1, to aid clarity. To make the seal the flanges are brought together, nuts and bolts are fitted through holes 14 to 19 and 20 to 25 and tightened, thereby compressing O-ring 7 against PTFE coat 10.

O-ring 7 is preferably composed of Viton or Kalrez (which are trademarks of E. I. Du Pont de Nemours & Company). The invention is not restricted to circular O-rings but may comprise an elliptical O-ring for example as required by the shape of the flange; also the O-ring is not necessarily circular in cross-section. Annular groove 8 in FIG. 1 has a rectangular cross-section, however trapezoidal or other grooves designed to retain an O-ring may be used, as will be illustrated in further examples (FIGS. 5 to below. Any conventional design of O-ring and groove may be employed. Flanges 1 and 4 and pipes 3 and 6 are preferably manufactured from stainless steel, to be compatible with ultra-high vacuum (uhv) conditions; welds 2 and 5 are conventional uhv-compatible welds.

PTFE coat 10 may be applied to region 11 of face 12 by any convenient means though we have found the following procedure to be most suitable. Region 11 of face 12 is cleaned with a finishing pad (for example Scotch Brite (Trademark) red grade), using a rotary action concentric to axis 34 thereby ensuring that there are no radial grain marks on the surface. Then face 12 is flooded with isopropyl alcohol and wiped clean with tissue; the surface must be clean but not polished, in order to assist adhesion of the coat. Next a mask may be fitted to face 12 leaving exposed only region 11, and a preparation known as Fluoralon B.5531 is applied to region 11. Fluoralon B.5531 is supplied by Fluorocarbon Industrial Treatments of Sheffield, England, and comprises PTFE, an organic clay thixotropic agent, and an amide resin, dissolved in organic solvents. After application the Fluoralon B.5531 is cured, a process which may be accelerated by heating typically at 250° C. for several hours.

Figure 4:
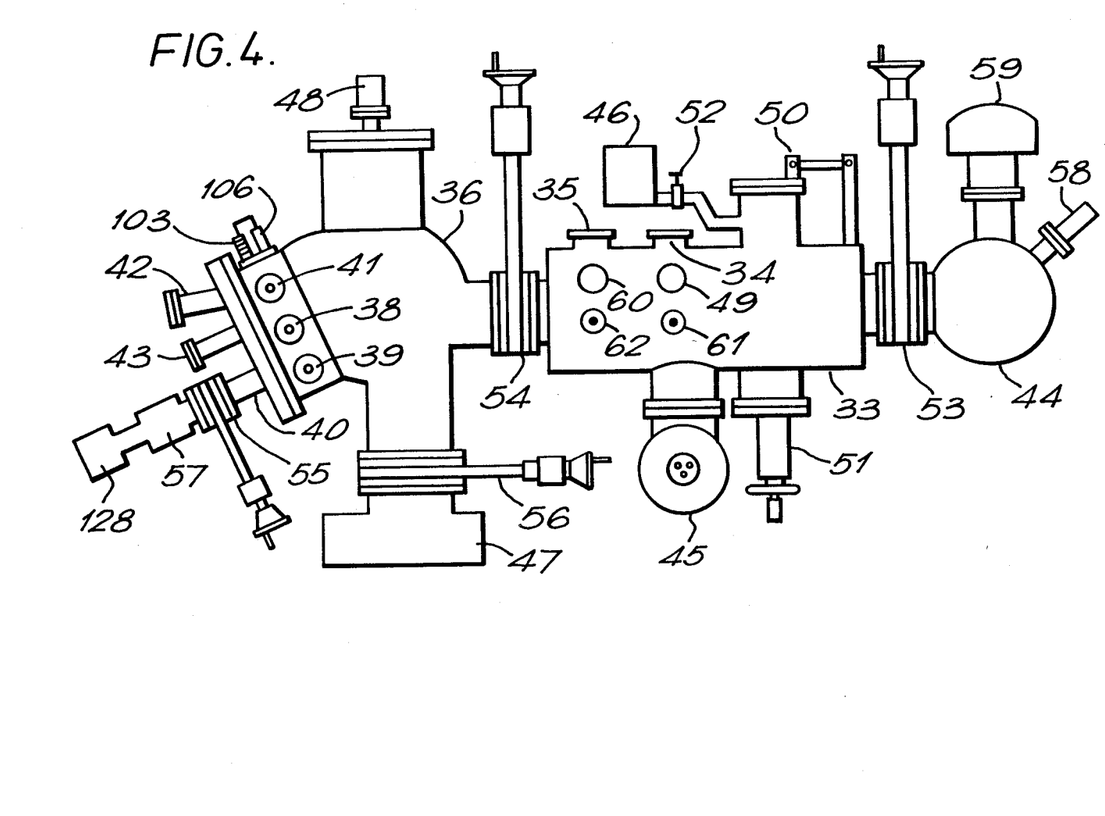
FIG. 4 shows a vacuum system, which is an apparatus for the processing of semiconductors by molecular beam epitaxy, having bakeable seals according to the invention.
Figure 8:
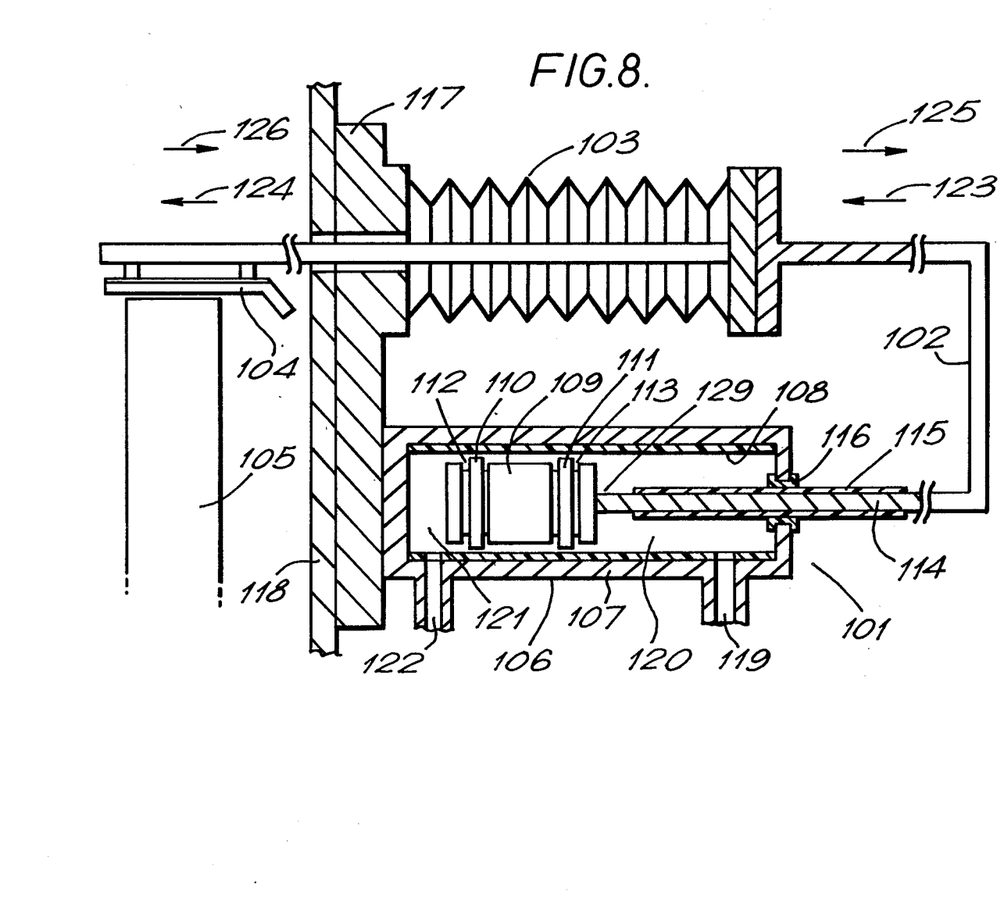
FIG. 8 shows a bakeable pneumatic actuator, according to another aspect of the invention.

Referring next to FIG. 4 there is shown a typical apparatus for the processing of semiconductors by molecular beam epitaxy, having chambers sealed according to the invention. The system comprises: a preparation chamber 33, having heating means 34 with a window 49 and a manipulator 61, and also sputtering means 35 with a window 60 and a manipulator 62; a deposition chamber 36, with housings containing Knudsen cells 38 to 43 from which material for deposition is produced; and an analytical chamber 44 having means for analyzing samples using an electron gun 58 and a spectrometer 59. Several pumps are provided as shown, for example, by pumps 45 to 48. Samples are transferred between the chambers by manipulators, which are not shown but may typically be as described in United Kingdom Patent Application No. 2095704. Also shown in FIG. 4 is a pneumatic actuator, comprising a housing 106 and a bellows 103, which is provided to operate a shutter covering a Knudsen cell 105 in housing 41, as will be described later with reference to FIG. 8a number of such actuators may be provided corresponding one to each Knudsen cell.

Samples are admitted to preparation chamber 33 via a lock system which comprises an entry door 50, a manipulator 51, a valve 52, and pump 46; the operation of the lock system will be described later with reference to FIG. 5. Also shown in FIG. 4 are bakeable gate valves 53 to 56, having seals according to the invention which will be described later with reference to FIGS. 6 and 7. A chamber 57 shown in FIG. 4 is provided to allow the introduction of material into cell 40. The provision of bakeable gate valve 55 allows chamber 57 to be baked while isolated from cell 40; a pump 128 is provided for evacuating chamber 57.

Figure 5:
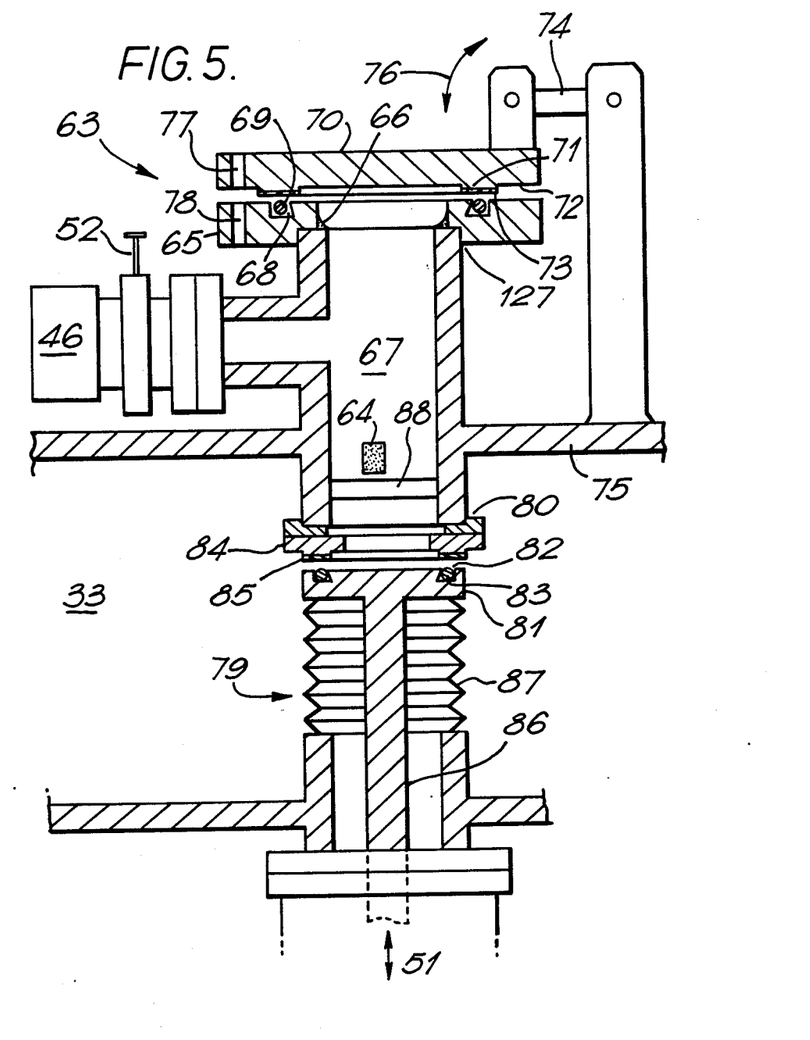
FIG. 5 shows a bakeable vacuum entry lock.

Referring next to FIG. 5 there is shown an entry lock assembly 63 by which a sample 64 may be introduced into chamber 33. An annular flange 65 is fixed by a weld 66 to a first end 127 of an entry port 67, and has an annular groove 68 of trapezoidal cross-section, as shown, in which is located an O-ring 69. A door flange 70 has, applied to a region 71 of a face 72, a PTFE coat 73. A hinge assembly 74 is provided, fixed to flange 70 and a wall 75 of chamber 33 as shown, to allow movement of flange 70 as indicated by an arrow 76. We have found that atmospheric pressure on flange 70 may be sufficient to hold that flange in place, and may form an adequate seal. However, for extra security a clamping means, for example a G-clamp assembly (not shown) may be applied to hold flanges 70 and 65 together; alternatively a bolt may be fitted through holes 77 and 78, or a plurality of bolts and holes may be provided around the perimeter of the flanges. An alternative form of entry lock assembly comprises: a door flange having an annular groove with an O-ring located therein, and an annular flange having a face coated with PTFE for sealing against the O-ring in the door flange.

Entry lock assembly 63 also comprises a bellows valve 79 which may be used to close entry port 67 at its internal second end 80. Bellows valve 79 comprises: a first member which is a flange 81, having an annular groove 82 with an O-ring 83; a second member which is a flange 84 having a seal face 85 coated with PTFE; a shaft 86; and a bellows 87 to accommodate the movement of shaft 86 and flange 81.

To operate entry lock assembly 63, manipulator 51 (FIG. 4) is used to compress flange 81 and hence O-ring 83 against seal face 85, door flange 70 is opened, and sample 64 is placed inside entry port 67. In FIG. 5 sample 64 is shown symbolically resting upon a support 88, though it will be appreciated that any suitable manipulator or mounting may be employed. Then door flange 70 is closed and entry port 67 is evacuated, by opening valve 52 to pump 46. The assembly may be baked at this stage. Next manipulator 51 is used to lower flange 81 away from end 80 of entry port 67, and sample 64 is taken from support 88 by a suitable manipulator (not shown). Valve 52 may be a gate valve having a bakeable O-ring seal, as will next be described.

Figure 6:
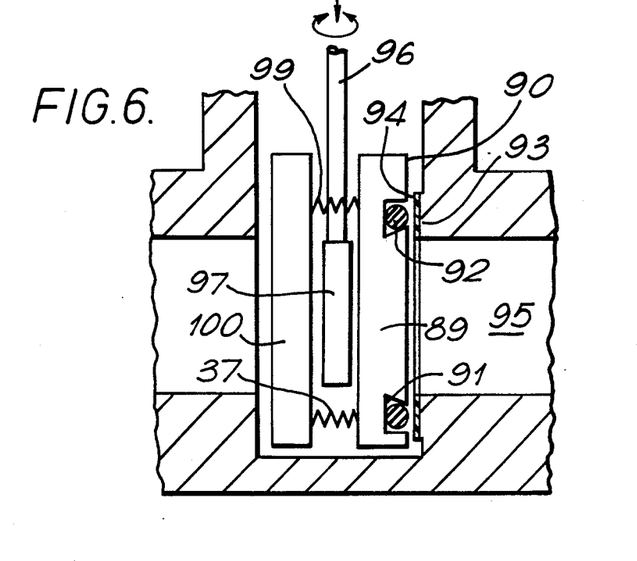
FIGS. 6 and 7 show a bakeable gate valve.
Figure 7:
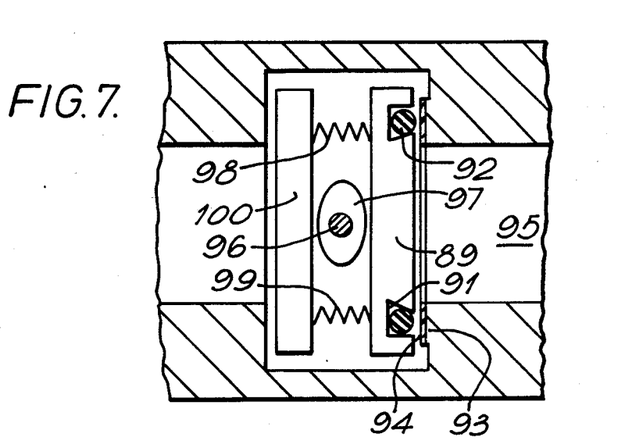

Two views of a gate valve are shown by FIGS. 6 and 7. Referring first to FIG. 6 there is shown: a valve gate 89 having a surface 90 in which is formed an annular groove 91, with an O-ring 92 located in groove 91, and an annular valve seat 93 coated with a coat 94 composed substantially of PTFE. Gate 89 is moved in to, and out of, a passage 95 by a shaft 96 as required. The invention may comprise any known means to urge gate 89 against seat 93, as described for example in U.S. Pat. Nos. 3,397,862 or 4,052,036; FIGS. 6 and 7 show a simple cam and spring arrangement in which, as can be seen from FIG. 7, there is provided an elliptical cam 97 which may be rotated by shaft 96, thereby urging gate 89 against seat 93, opposed by the action of four springs (of which springs 98, 99 and 37 are shown affixed between gate 89 an a back plate 100). An alternative form of gate valve comprises: a valve seat having an annular groove with an O-ring located therein, and a valve gate having a face coated with PTFE for sealing against the O-ring in the valve seat.

Referring next to FIG. 8 there is shown a pneumatic actuator 101 attached via a linking arm 102 and a bellows 103 to a shutter blade 104 capable of covering a Knudsen cell 105. A housing 106 has a wall 107 with a PTFE coat 108. A piston 109 has two Viton O-rings 110 and 111 located in circumferential grooves 112 and 113 respectively; the O-rings form a substantially gas-tight seal against PTFE coat 108. A rod 114 is attached, at its first end 129, to piston 109 and is coated with PTFE, forming a surface 115 in contact with a Viton sealing ring 116 located in housing 106 as shown. Bellows 103 and housing 106 are affixed to a flange 117, which is mounted on a wall 118 of chamber 6 (FIG. 4) as shown; wall 118 may itself be part of a flange, but for clarity this is not shown on FIG. 8. An example of the positioning of actuator 101 is shown in FIG. 4. In operation, a gas which may be air, is pumped into a region 120 via a gas port 119 while gas is pumped out of a region 121 through a gas port 122, hence the gas pressure in region 120 is greater than in region 121. Consequently piston 109 and arm 102 move in the direction indicated by an arrow 123, compressing bellows 103, and moving shutter blade 104 in the direction shown by an arrow 124 to a position as shown covering cell 105. Conversely to open the shutter, gas is pumped out of region 120, through port 119 and into region 121 through port 122, thereby moving piston 109 and arm 102 in the direction shown by an arrow 125, and blade 104 away from cell 105 in the direction shown by an arrow 126. It is found that, as in the cases described where an elastomeric seal is used to seal a high or ultra high vacuum chamber, the provision of seal faces (i.e. coats 108 and 115) composed substantially of PTFE provides a system which can withstand baking. This is advantageous because it is then not necessary to detach actuator 101 from wall 118 before baking chamber 36. To assist the illustration the thicknesses of coats 108 and 115 are exaggerated on FIG. 8.

Figure 9:
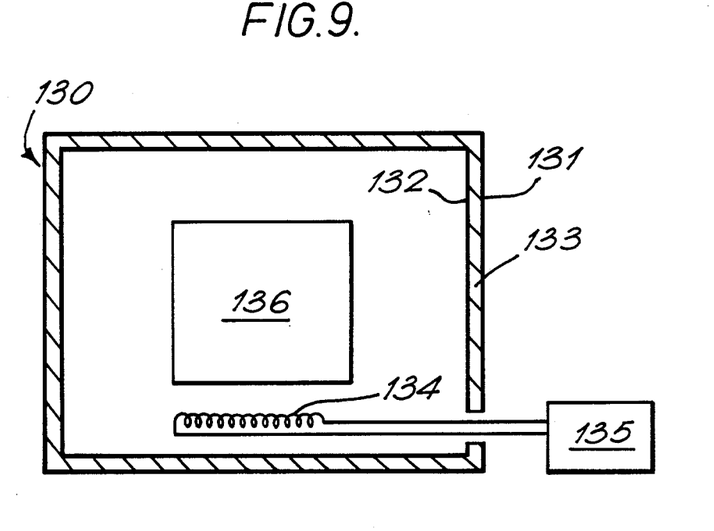
FIG. 9 illustrates a typical baking means.

Referring next to FIG. 9 there is shown a baking means 130 comprising: an enclosure with aluminum walls 131 and 132, between which is disposed rock wool insulation 133; and an electrical heating element 134 powered from a supply 135. A vacuum chamber 136 is shown disposed within baking means 130. In this way either the entire MBE apparatus, as shown in FIG. 4, may be disposed within baking means 130, or a separate baking means may be assembled around one or more chambers of an MBE apparatus as may be convenient, with the walls of the baking means adapted to fit around the chamber(s).

What is claimed is:

1. A bakeable sealing means comprising: a first sealing element composed substantially of an elastomeric material; a second sealing element comprising PTFE; and means for engaging said first sealing element with said second sealing element and for compressing said first sealing element prior to baking whereby said sealing means is baked with said sealing elements in engaged condition and with said first sealing element in a compressed state.

2. A bakeable sealing means as claimed in claim 1 in which said first sealing element is an elastomeric gasket, and comprising a first member and a second member between which said gasket may be compressed, wherein at least one of said first and second members has a surface comprising PTFE in a region contactable with said gasket.

3. A bakeable sealing means as claimed in claim 1 in which said first sealing element is an elastomeric gasket, and comprising a first member and a second member between which said gasket may be compressed, wherein at least one of said first and second members has a surface coated with a material comprising PTFE in a region contactable with said gasket.

4. A bakeable sealing means as claimed in claim 1, in which said first sealing element is an elastomeric O-ring gasket.

5. A bakeable sealing means as claimed in claim 1 and in which said first sealing element is an elastomeric O-ring gasket, and comprising a first flange and a second flange between which said gasket may be compressed; said first flange having an annular groove in which said gasket is located, and said second flange having, as said second sealing element, a surface coated with a material comprising PTFE over a region contractable with said gasket.

6. A method of sealing a bakeable vacuum system comprising the steps of:

engaging a first sealing element composed substantially of an elastomeric material with a second sealing element comprising PTFE;

applying a sealing force to compress said first sealing element; and baking the vacuum system with said first and second sealing element in the engaged condition and with said first sealing element in a compressed state.

* * * * *